US008066535B2

(12) United States Patent
Hsiao et al.

(10) Patent No.: US 8,066,535 B2
(45) Date of Patent: Nov. 29, 2011

(54) MOUNTING APPARATUS FOR ELECTRONIC DEVICE

(75) Inventors: Yi-Liang Hsiao, Taipei Hsien (TW); Hsueh-Chin Lu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/852,476

(22) Filed: Aug. 7, 2010

(65) Prior Publication Data

US 2011/0244717 A1    Oct. 6, 2011

(30) Foreign Application Priority Data

Mar. 31, 2010 (TW) ................................ 99110016 A

(51) Int. Cl.
*H01R 9/22* (2006.01)

(52) U.S. Cl. ....................................................... 439/719
(58) Field of Classification Search .................. 439/928, 439/719, 61; 361/826, 820; 174/97
See application file for complete search history.

(56) References Cited

U.S. PATENT DOCUMENTS

| 5,788,087 A * | 8/1998 | Orlando .......................... 211/26 |
| 5,855,494 A * | 1/1999 | Blaszczyk et al. ............. 439/502 |
| 5,957,556 A * | 9/1999 | Singer et al. ............... 312/223.6 |

* cited by examiner

*Primary Examiner* — Phuong Dinh
(74) *Attorney, Agent, or Firm* — Altis Law Group, Inc.

(57) ABSTRACT

A mounting apparatus includes a mounting rack and an electronic device. The mounting rack includes a frame. An interface is defined in the frame. The frame includes a securing member. An electronic device is inserted in the mounting rack from front to back. The electronic device includes a back wall. The back wall is adjacent to the frame and defines a port for receiving a cable. The cable is secured to the securing member and inserted into the interface of the frame.

19 Claims, 4 Drawing Sheets

MOUNTING APPARATUS FOR ELECTRONIC DEVICE

BACKGROUND

1. Technical Field

The present disclosure relates to a mounting apparatus for an electronic device for arranging cables of the electronic device.

2. Description of Related Art

A server system is a computer system that provides essential services across a network. Many cables are needed in the server system for transferring signals or providing power. Usually, the cables are not arranged in a well-ordered manner. It is inconvenient for the users to distinguish the cables from each other and which cables are for what purpose.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
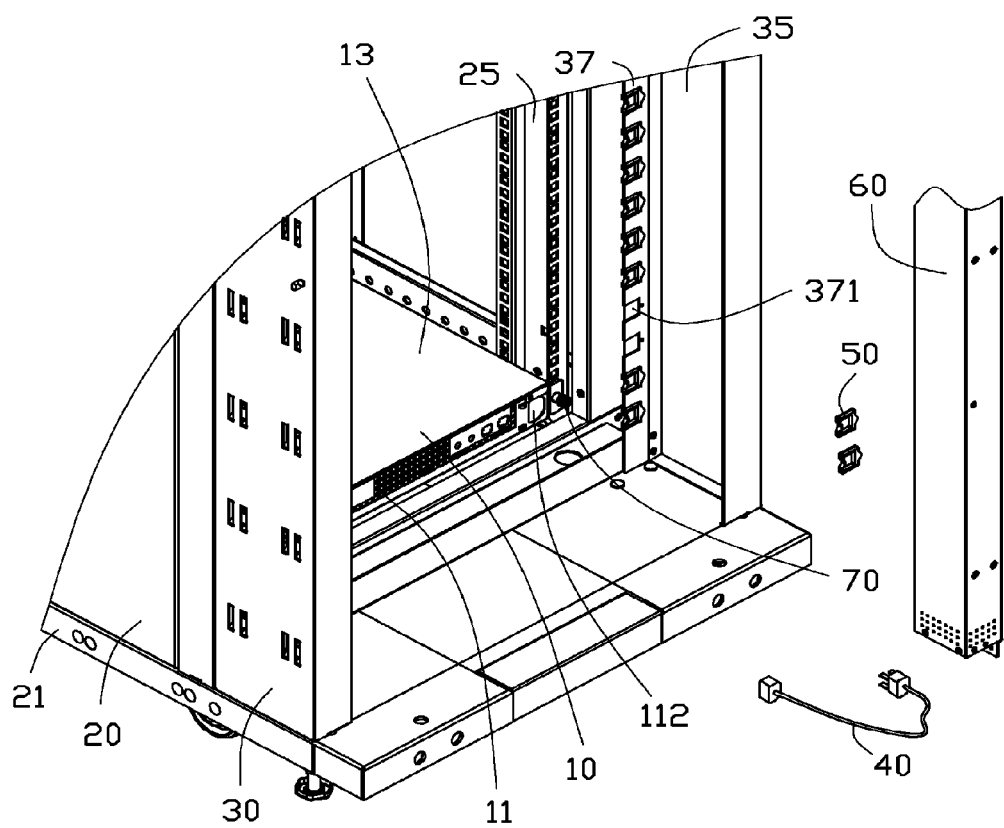
FIG. 1 is a partially exploded, partial view of an electronic device and a mounting rack in accordance with an embodiment.

Referring to FIG. 1, a mounting apparatus in accordance with an embodiment is configured for receiving electronic devices 10. The electronic devices 10 can be inserted into the mounting apparatus from front to back. Each electronic device 10 includes a back wall 11 and a top wall 13 connected to the back wall 11. The back wall 11 includes a plurality of ports 112 for receiving cables 40. In one embodiment, the electronic devices 10 may be servers, and the ports 112 may be power ports. The cables 40 inserted into the ports 112 need to be organized for easy access and maintenance.

The mounting apparatus includes a mounting rack 20 and a frame 30. In one embodiment, the mounting rack 20 is a server rack. The mounting rack 20 includes a base plate 21, a top plate (not shown) and a plurality of supports 25 at the back of the frame 30. The supports 25 are capable of supporting the mounting rack 20. A plurality of fasteners 70, such as screws, is capable of fixing the electronic devices 10 to the supports 25. The base plate 21 is perpendicular to the support 25.

Figure 2:
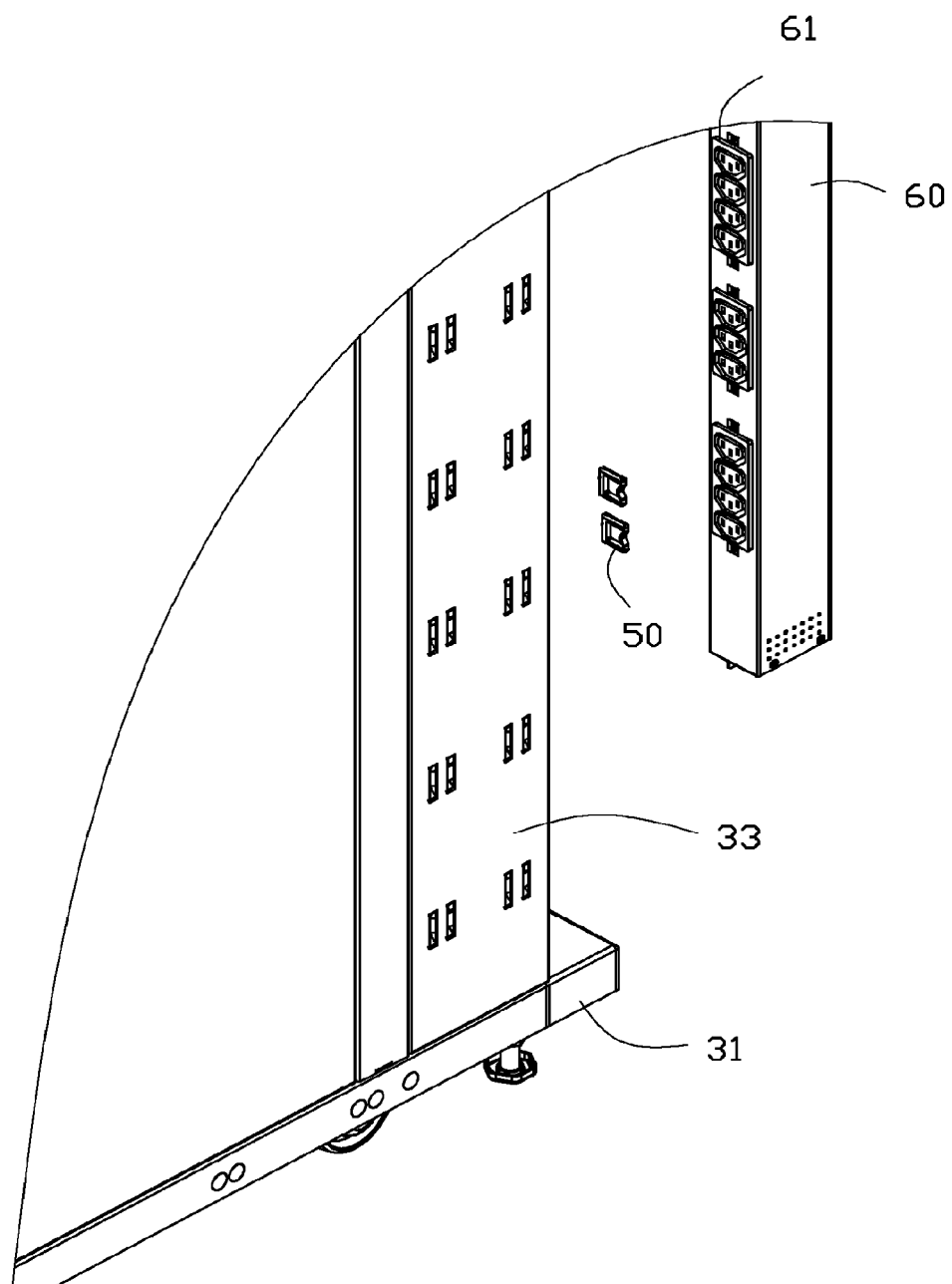
FIG. 2 is similar to FIG. 1, but viewed from another aspect.
Figure 3:
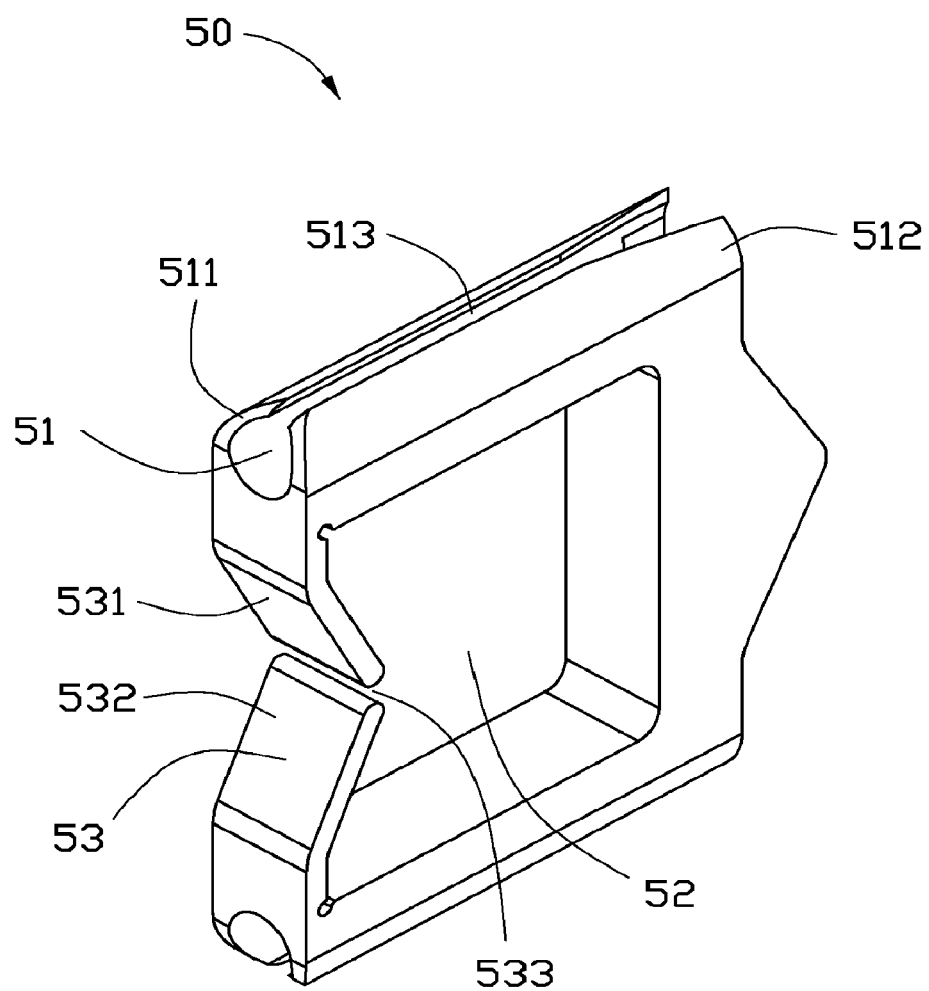
FIG. 3 is a perspective view of a securing member of FIG. 1 in accordance with an embodiment.

Referring to FIGS. 2 and 3, the frame 30 includes a bottom wall 31, two sidewalls 33, 35 and a securing plate 37 connected to the sidewall 35. A height of the mounting rack 20 is equal to a height of the frame 30. A plurality of securing holes 371 is defined in the securing plate 37. A securing member 50 is secured to the securing plate 37. Two grooves 51 are defined in the securing member 50 to receive two edges of the securing hole 371.

The securing member 50 has a first flange 511 and a second flange 512. A first slot 513 is defined between the first flange 511 and the second flange 512. The edge of the securing hole 371 is inserted into the first slot 513 so that the securing member 50 is secured to the securing plate 37. The first slot 513 communicates with the groove 51. The first flange 511 and the second flange 512 clasp the edge of the securing hole 371.

The cables 40 are secured on the securing member 50. An opening 52 is defined in the securing member 50 for receiving the cables 40. A clamp 53 is formed on an end of the securing member 50. The cables 40 are received in the opening 52 through the clamp 53. A power strip 60 is secured on the sidewall 35. The power strip 60 includes a plurality of power outlets 61 directed towards the electronic devices 10, corresponding to the power ports 112 of the electronic devices 10.

The clamp 53 includes an elastic first extending portion 531 and an elastic second extending portion 532. Two ends of the securing member 50 extend towards an inner side of the securing member 50. The first extending portion 531 and the second extending portion 532 form a sharp angle. A second split 533 is defined between the first extending portion 531 and the second extending portion 532. The cable 40 is inserted in the opening 52 through the second split 533.

A gauge of the cable 40 is larger than a width of the second split 533. When the cable 40 is inserted in the opening 52 through the second split 533, the first extending portion 531 and the second extending portion 532 flex to allow the cable 40 to enter within the opening 52. The first extending portion 531 and the second extending portion 532 return to an original position. In the original position, the first extending portion 531 and second extending portion 532 extends inward the opening 52 slightly. The cable 40 is securely held after the cable 40 is inserted into the opening 52 and cannot easily be removed without manually pulling it back through the opening 52.

Figure 4:
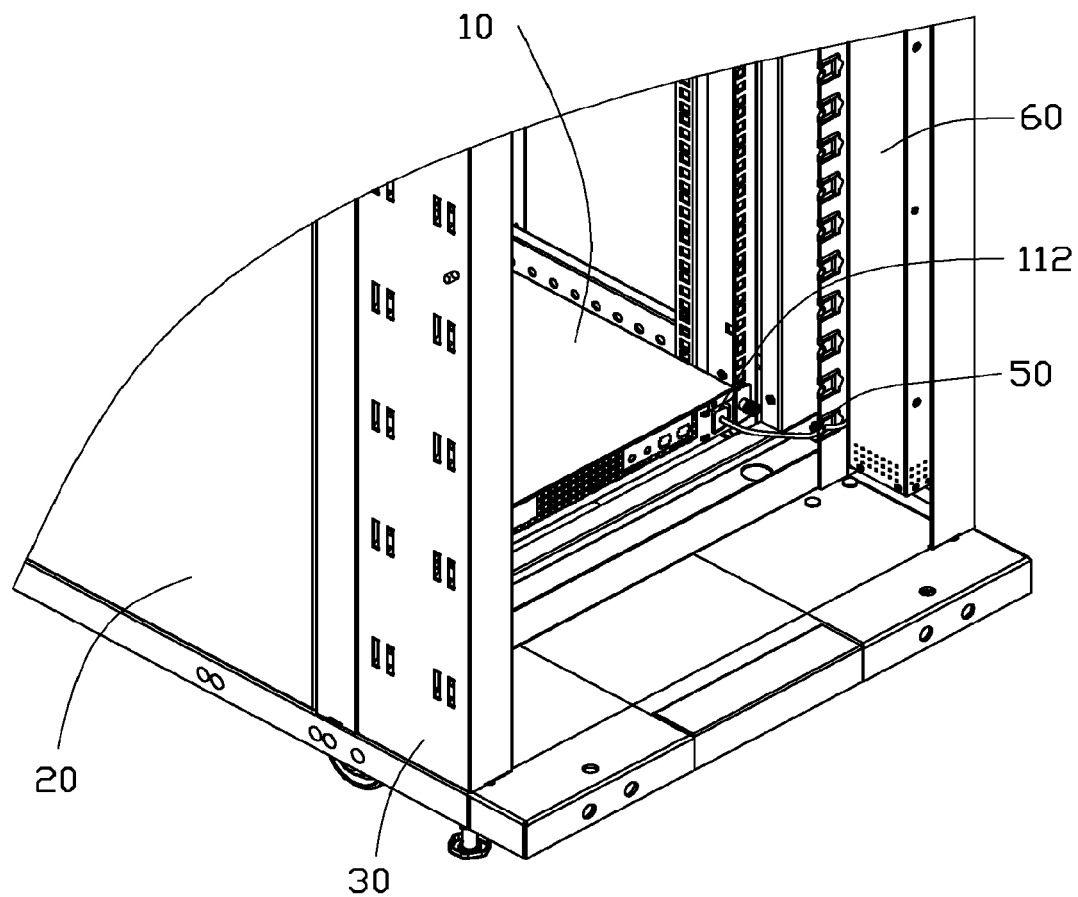
FIG. 4 is an assembled, partial view of the electronic device and the mounting apparatus of FIG. 1.

Referring to FIG. 4, in assembly, the electronic devices 10 are installed in the mounting rack 20. The top wall 13 is parallel to the base plate 21. The back wall 11 is secured on the supports 25. One end of the cable 40 is inserted into the port 112 of the back wall 11. The cable 40 is engaged with the securing member 50. The cable 40 is inserted into the opening 52, and the other end of the cable 40 is inserted into one of the power outlets 61 of the power strip 60.

The cables 40 are held in position enabling the power outlet 61 of the power strip 60 to be used to arrange the cables 40 in a organized manner. Each of the power cables 40, of the electronic devices 10, can be inserted into the power outlet 61 of the power strip 60 to not only supply power for the electronic device 10, but to do so in an organized manner.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A mounting apparatus for an electronic device, the electronic device comprising a back wall, the back wall defining a port for receiving a cable, the mounting apparatus comprising:

a frame comprising a side plate and a securing plate substantially perpendicular to the side plate; a power strip attached to the side plate, and a securing member attached to the side plate; an interface defined in the power strip;

wherein the back wall is adjacent to the securing plate, the securing member manages the cable to allow the cable to be inserted in the interface.

2. The mounting apparatus of claim 1, wherein a securing hole is defined in the securing plate, the securing hole is capable of having the cable inserted therein.

3. The mounting apparatus of claim 2, wherein two receiving grooves are defined in two sides of the securing member to receive two edges of the securing hole.

4. The mounting apparatus of claim 3, wherein an opening is defined in the securing member that is capable of receiving the cable.

5. The mounting apparatus of claim 4, wherein a clamp is formed in the securing member, the opening is capable of having the cable inserted therein through the clamp.

6. The mounting apparatus of claim 1, wherein the back wall is perpendicular with the side plate.

7. The mounting apparatus of claim 1 further comprising a plurality of retaining portions fixed to the back wall.

8. The mounting apparatus of claim 1, wherein the interface is a power outlet.

9. A mounting apparatus comprising:
a frame, an interface defined in the frame, the frame comprising a securing member and a securing plate, and a slot defined in the securing member to receive the securing plate;

wherein the interface is capable of having a cable inserted therein.

10. The mounting apparatus of claim 9, wherein the frame comprises a side plate having the interface.

11. The mounting apparatus of claim 10, wherein a securing hole is defined in the securing plate, and the securing hole is capable of having the cable inserted therein.

12. The mounting apparatus of claim 11, wherein two grooves are defined in two sides of the securing member to receive two edges of the securing hole.

13. The mounting apparatus of claim 12, wherein an opening is defined in the securing member that is capable of receiving the cable.

14. The mounting apparatus of claim 13, wherein a clamp is formed in the securing member, and the opening is capable of having the cable inserted therein through the clamp.

15. The mounting apparatus of claim 9, wherein the interface is a power outlet.

16. A mounting apparatus comprising:
a frame defining an interface;
a securing member attached to the interface, comprising a clamp; the clamp comprising a first elastic extending portion and a second elastic extending portion; a split is defined between the first elastic extending portion and the second elastic extending portion;

wherein the split is adapted to allow a cable to engage the securing member, and the interface is adapted to have the cable inserted therein.

17. The mounting apparatus of claim 16, wherein the first extending portion is biased towards the second extending portion.

18. The mounting apparatus of claim 16, wherein the frame comprising a securing plate, a securing hole is defined in the securing plate, and two grooves are defined in two sides of the securing member to receive two edges of the securing hole.

19. The mounting apparatus of claim 16, wherein the frame comprising an opening for receiving the cable, and the opening communicates with the split.

* * * * *